United States Patent
Kato et al.

(10) Patent No.: US 7,068,116 B2
(45) Date of Patent: Jun. 27, 2006

(54) OSCILLATION CIRCUIT AND SEMICONDUCTOR DEVICE FREE FROM THE INFLUENCE OF SOURCE VOLTAGE, TEMPERATURE AND FLUCTUATIONS IN THE INVERTER THRESHOLD VOLTAGE

(75) Inventors: Tatsuo Kato, Kawasaki (JP); Suguru Tachibana, Kawasaki (JP)

(73) Assignee: Fuiitsu Limited, Kawasaki (JP)

( * ) Notice: Subject to any disclaimer, the term of this patent is extended or adjusted under 35 U.S.C. 154(b) by 0 days.

(21) Appl. No.: 10/877,981

(22) Filed: Jun. 29, 2004

(65) Prior Publication Data

US 2005/0168293 A1    Aug. 4, 2005

(30) Foreign Application Priority Data

Jan. 29, 2004   (JP) ............................. 2004-021520

(51) Int. Cl.
    *H03K 3/26* (2006.01)
(52) U.S. Cl. ........................ 331/111; 331/143
(58) Field of Classification Search ........... 331/111, 331/143
    See application file for complete search history.

(56) References Cited

U.S. PATENT DOCUMENTS 5,125,112 A * 6/1992 Pace et al. .................. 340/7.32
6,853,258 B1 * 2/2005 Toliver et al. ................ 331/34
6,894,574 B1 * 5/2005 Nagatomo .................. 331/135
6,914,494 B1 * 7/2005 Chen .......................... 331/111

FOREIGN PATENT DOCUMENTS

JP    2003-37437    2/2003

* cited by examiner

Primary Examiner—Joseph Chang
(74) Attorney, Agent, or Firm—Arent Fox PLLC (57) ABSTRACT

An oscillation circuit capable of outputting an oscillation signal of constant frequency free from the influence of source voltage, temperature, and nonuniformity and fluctuation in inverter threshold voltage. An inverter inverts a voltage applied to one end of a capacitive element and outputs the inverted voltage to transistors and an inverter. A constant voltage source outputs a constant voltage free from the influence of source voltage and temperature. The transistors connect the other end of the capacitive element to the constant voltage source or ground in accordance with the voltage output from the first-mentioned inverter. A constant current source causes a constant current free from the influence of the source voltage and temperature to flow into or out of the one end of the capacitive element in accordance with the voltage from the second-mentioned inverter connected to the first-mentioned inverter. Consequently, the voltage at the one end of the capacitive element varies with a fixed amplitude about the threshold voltage of the first-mentioned inverter without being influenced by the source voltage and temperature, and a constant current free from the influence of the source voltage and temperature flows into and out of the one end of the capacitive element to charge and discharge the capacitive element over fixed periods.

18 Claims, 6 Drawing Sheets

OSCILLATION CIRCUIT AND SEMICONDUCTOR DEVICE FREE FROM THE INFLUENCE OF SOURCE VOLTAGE, TEMPERATURE AND FLUCTUATIONS IN THE INVERTER THRESHOLD VOLTAGE

CROSS-REFERENCE TO RELATED APPLICATIONS

This application is based upon and claims priority of Japanese Patent Application No. 2004-021520, filed on Jan. 29, 2004, the contents being incorporated herein by reference.

BACKGROUND OF THE INVENTION (1) Field of the Invention

The present invention relates to an oscillation circuit and a semiconductor device, and more particularly, to an oscillation circuit capable of oscillation by utilizing charging/discharging of a capacitive element and a semiconductor device including the oscillation circuit.

(2) Description of the Related Art

Currently, multifunctional semiconductor devices are available and some semiconductor devices operate using an oscillation circuit incorporated therein. Such oscillation circuits built into semiconductor devices are often required that the oscillation frequency thereof should remain unchanged regardless of temperature or source voltage.

Conventional oscillation circuits built into semiconductor devices are constituted by an integrating circuit or differentiating circuit including a capacitive element and a resistive element and oscillate by making use of the charging/discharging characteristic of the capacitive and resistive elements.

Figure 5:
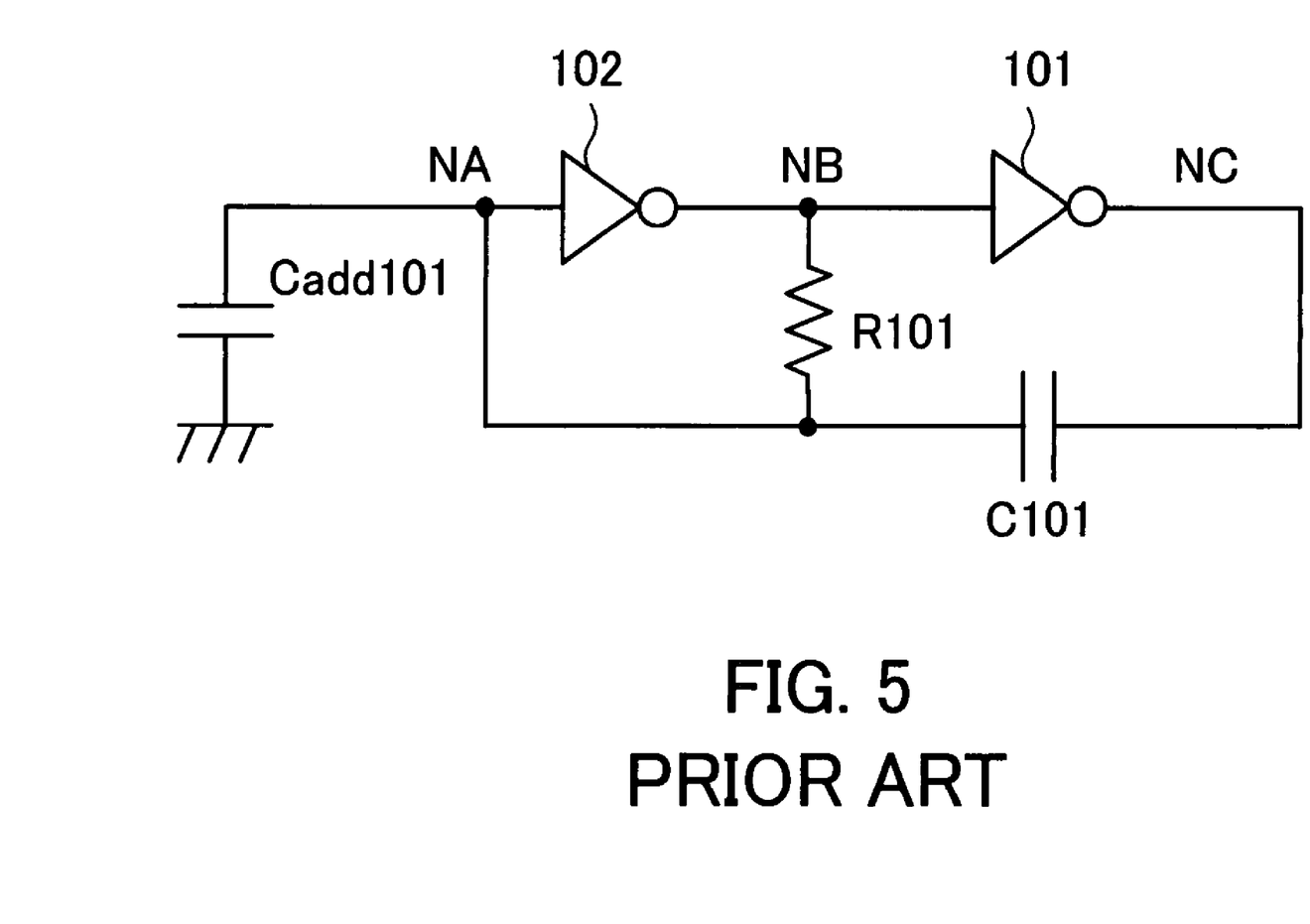
FIG. 5 is a circuit diagram of a conventional oscillation circuit constituted by a differentiating circuit.

FIG. 5 is a circuit diagram of a conventional oscillation circuit constituted by a differentiating circuit.

As shown in the figure, the oscillation circuit has a series connection composed of an inverter 101, a capacitor C101 and a resistor R101, thus constituting a closed circuit. An inverter 102 is connected to the resistor R101 in parallel therewith.

In the illustrated oscillation circuit, the input-side node of the inverter 102 is referred to as node NA, the input-side node of the inverter 101 as node NB, and the output-side node of the inverter 101 as node NC. A capacitor Cadd101 represents a parasitic capacitance between the node NA and ground. Operation of the oscillation circuit of FIG. 5 will be now described with reference to a timing chart.

Figure 6:
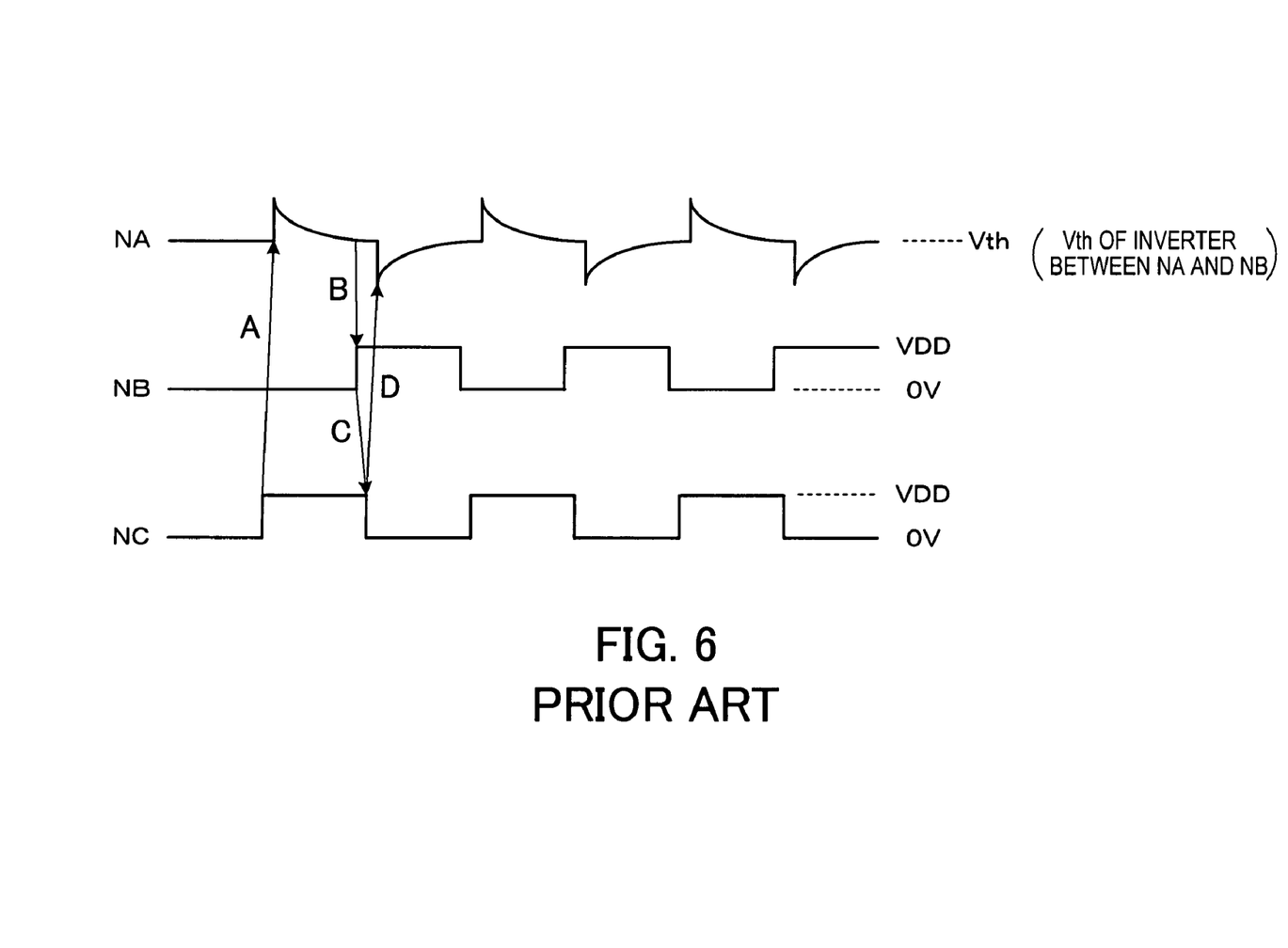
FIG. 6 is a timing chart illustrating operation of the oscillation circuit of FIG. 5.

FIG. 6 is a timing chart illustrating the operation of the oscillation circuit of FIG. 5.

In FIG. 6 are shown voltage changes at the nodes NA, NB and NC of the oscillation circuit of FIG. 5. The voltage at the node NA varies about a threshold voltage Vth of the inverter 102, and the voltages at the nodes NB and NC vary between 0 V and a source voltage VDD supplied to the inverters 101 and 102.

When the voltage of the node NC rises to VDD, the voltage of the node NA also rises (arrow A) due to coupling through the capacitor C101. Subsequently, because of discharging of the capacitors C101 and Cadd101, the voltage of the node NA gradually falls. When the voltage of the node NA drops to a level close to the threshold voltage Vth, the voltage of the node NB is raised to VDD (arrow B) by the inverter 102. Since the voltage of the node NB rises to VDD, the voltage of the node NC is decreased to 0 V (arrow C) by the inverter 101. At this time, the voltage drop of the node NC takes place later than the voltage rise of the node NB due to delay of the inverter 101. When the voltage of the node NC drops to 0 V, the voltage of the node NA also falls (arrow D) due to coupling through the capacitor C101. The capacitors C101 and Cadd101 are thereafter charged through the resistor R101, so that the voltage of the node NA gradually rises. The oscillation circuit of FIG. 5 oscillates by repeating the above operation.

The oscillation period of the oscillation circuit of FIG. 5 can be expressed by the following Equation (1):

$$T = R \cdot (C + Cadd) \cdot \left[ \log_e \frac{\left\{ \left( \frac{C}{(C + Cadd)} \right) \cdot VDD + Vth \right\}}{Vth} + \log_e \frac{Vth - \left\{ 1 + \frac{C}{(C + Cadd)} \right\} \cdot VDD}{Vth - VDD} \right] \quad (1)$$

where VDD is the source voltage supplied to the inverters 101 and 102, Vth is the logical threshold voltage of the inverter 102, Cadd is the capacitance of the capacitor Cadd101, C is the capacitance of the capacitor C101, and R is the resistance of the resistor R101.

The threshold voltage Vth of the inverter 102 can normally be regarded as proportional to the source voltage VDD. Given the proportionality constant a, therefore, the threshold voltage Vth can be expressed as Vth=α·VDD. Substituting this equation into Equation (1), then Equation (1) can be rewritten as Equation (2) below.

$$T = R \cdot (C + Cadd) \cdot \left[ \log_e \frac{\left\{ \left( \frac{C}{(C + Cadd)} \right) + \alpha \right\}}{\alpha} + \log_e \frac{\alpha - \left\{ 1 + \frac{C}{(C + Cadd)} \right\}}{\alpha - 1} \right] \quad (2)$$

Equation (2) reveals that the oscillation circuit of FIG. 5 has the following two features: First, the oscillation period (frequency) is not dependent on the voltage VDD. Secondly, the oscillation period is determined by the capacitance of the capacitor C101, the resistance of the resistor R101, the threshold voltage Vth of the inverter 102, and the parasitic capacitance of the node NA.

There has also been proposed a CR oscillation circuit for outputting an oscillation signal of predetermined oscillation frequency by using the charging/discharging characteristic of capacitive and resistive elements, and the CR oscillation circuit includes a constant current source circuit supplied with a bias voltage from a bias circuit to generate and supply a constant charging/discharging current, and a charging/discharging circuit including a capacitive element and a resistive element for outputting an oscillation signal based on the charging/discharging current supplied from the constant current source circuit (see Japanese Unexamined Patent Publication No. 2003-37437 (paragraph nos. [0022] to [0036], FIGS. 1 to 3), for example). This CR oscillation circuit generates a stable, source voltage-independent oscillation signal by using the constant current source circuit for generating and supplying a constant charging/discharging current.

SUMMARY OF THE INVENTION

The present invention provides an oscillation circuit capable of oscillation by utilizing charging/discharging of a capacitive element. The oscillation circuit comprises an inverter for inverting a voltage applied to one end of the capacitive element and outputting the inverted voltage, a constant voltage source for outputting a constant voltage free from influence of a source voltage and temperature, a switching circuit for connecting the other end of the capacitive element to one of the constant voltage source and ground in accordance with the voltage output from the inverter, and a constant current source for causing a constant current free from the influence of the source voltage and temperature to flow into or out of the one end of the capacitive element in accordance with the voltage output from the inverter.

There is also provided a semiconductor device including an oscillation circuit capable of oscillation by utilizing charging/discharging of a capacitive element. The semiconductor device comprises an inverter for inverting a voltage applied to one end of the capacitive element and outputting the inverted voltage, a constant voltage source for outputting a constant voltage free from influence of a source voltage and temperature, a switching circuit for connecting the other end of the capacitive element to one of the constant voltage source and ground in accordance with the voltage output from the inverter, and a constant current source for causing a constant current free from the influence of the source voltage and temperature to flow into or out of the one end of the capacitive element in accordance with the voltage output from the inverter.

The above and other features and advantages of the present invention will become apparent from the following description when taken in conjunction with the accompanying drawings which illustrate preferred embodiments of the present invention by way of example.

DESCRIPTION OF THE PREFERRED EMBODIMENTS

The oscillation circuit of FIG. 5 mentioned above in the "Description of the Related Art" section is associated with a problem that the oscillation period fails to remain constant if the resistance varies due to temperature change, as seen from Equations (1) and (2).

Also, the threshold voltage of the inverter is determined by the source-drain resistance ratio of internal N-channel and P-channel transistors. Thus, if the source-drain resistance ratio of the internal N-channel and P-channel transistors changes due to nonuniformity of transistor characteristics caused during fabrication process or due to temperature changes, the oscillation frequency also fluctuates.

On the other hand, the oscillation circuit disclosed in Japanese Unexamined Patent Publication No. 2003-37437 is associated with a problem that the oscillation frequency fluctuates if the resistance of the resistive element varies due to temperature change or if the threshold voltage for switching the charging/discharging current of the constant current source circuit fluctuates.

The present invention was made in view of the above circumstances, and an object thereof is to provide an oscillation circuit free from the influence of temperature and capable of outputting an oscillation signal of constant frequency even in cases where there is nonuniformity in inverter threshold voltage or the inverter threshold voltage fluctuates, and a semiconductor device including the oscillation circuit.

Embodiments of the present invention will be hereinafter described in detail with reference to the drawings.

Figure 1:
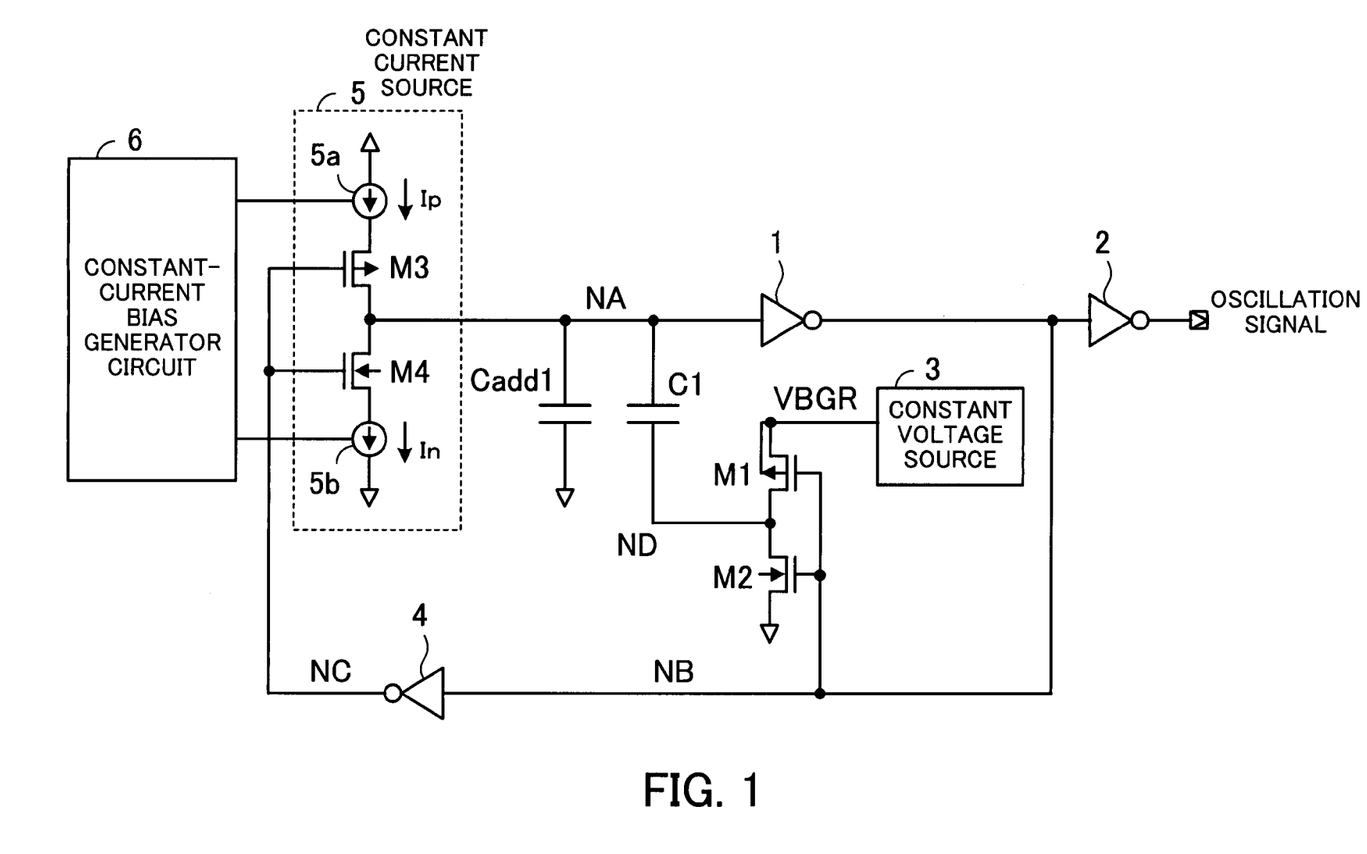
FIG. 1 is a circuit diagram of an oscillation circuit according to the present invention.

FIG. 1 is a circuit diagram of an oscillation circuit according to the present invention.

The oscillation circuit shown in the figure is formed on a semiconductor chip of a semiconductor device. The oscillation circuit includes a capacitive element C1 which is a capacitor, for example, inverters 1, 2 and 4, a constant voltage source 3, a constant current source 5, a constant-current bias generator circuit 6, and transistors M1 and M2.

In the illustrated oscillation circuit, the input-side node of the inverter 1 is referred to as node NA, the output-side node of the inverter 1 as node NB, the output-side node of the inverter 4 as node NC, and the drain-side node of the transistors M1 and M2 as node ND. A capacitive element Cadd1 represents a parasitic capacitance between the node NA and ground.

The input of the inverter 1 is connected to one end of the capacitive element C1. The inverter 1 outputs a ground voltage GND when the voltage applied to the one end of the capacitive element C1 is higher than or equal to a threshold voltage Vth. When the voltage applied to the one end of the capacitive element C1 is lower than the threshold voltage Vth, the inverter 1 outputs a source voltage VDD supplied thereto.

The input of the inverter 2 is connected to the output of the inverter 1. The inverter 2 inverts a rectangular-wave oscillation signal output from the inverter 1 and outputs the inverted signal.

The transistor M1 is a P-channel MOS transistor, and the transistor M2 is an N-channel MOS transistor. The gates of the transistors M1 and M2 are connected to the output of the inverter 1. The back gate and source of the transistor M1 are connected to each other and also connected to the constant voltage source 3. The drains of the transistors M1 and M2 are connected to each other and also connected to the other end of the capacitive element C1. The source of the transistor M2 is grounded.

In accordance with the voltage output from the inverter 1, the transistors M1 and M2 connect the other end of the capacitive element C1 to one of the constant voltage source 3 and the ground. When the voltage output from the inverter 1 is at the voltage GND (L state), the transistor M1 turns on and connects the other end of the capacitive element C1 to the constant voltage source 3. When the voltage output from the inverter 1 is at the voltage VDD (H state), the transistor M2 turns on and connects the other end of the capacitive element C1 to the ground.

The constant voltage source 3 outputs a constant voltage VBGR free from the influence of fluctuations in the source voltage supplied thereto and temperature. Thus, when connected to the constant voltage source 3, the other end of the capacitive element C1 is supplied with the constant voltage VBGR free from the influence of the source voltage and temperature.

The input of the inverter 4 is connected to the output of the inverter 1, and the output of the inverter 4 is connected to the constant current source 5. The inverter 4 inverts the output of the inverter 1 and outputs the result to the constant current source 5.

The constant current source 5 causes a constant current free from the influence of fluctuations in the source voltage supplied thereto and temperature to flow into or out of the one end of the capacitive element C1 in accordance with the output voltage of the inverter 1 applied thereto through the inverter 4. When the voltage output from the inverter 1 is at the voltage VDD, the constant current source 5 causes the constant current to flow into the capacitive element C1. When the voltage output from the inverter 1 is at the voltage GND, the constant current source 5 causes the constant current to flow out of the capacitive element C1.

The constant current source 5 includes transistors M3 and M4 and current sources 5a and 5b. The transistor M3 is a P-channel MOS transistor, and the transistor M4 is an N-channel MOS transistor. The gates of the transistors M3 and M4 are connected to the output of the inverter 4. The drains of the transistors M3 and M4 are connected to each other and also connected to the one end of the capacitive element C1.

The current source 5a is connected between a power source and the source of the transistor M3. Under bias control performed by the constant-current bias generator circuit 6, the current source 5a causes a constant current Ip free from the influence of fluctuations in the source voltage and temperature to flow into the one end of the capacitive element C1 through the transistor M3. The current source 5b is connected between the ground and the source of the transistor M4. Under the bias control of the constant-current bias generator circuit 6, the current source 5b causes a constant current In free from the influence of fluctuations in the source voltage and temperature to flow out of the one end of the capacitive element C1 through the transistor M4.

While the voltage VDD (H state) is output from the inverter 1, the inverter 4 outputs the voltage GND (L state). Consequently, the transistor M3 of the constant current source 5 turns on, causing the constant current Ip to flow into the one end of the capacitive element C1. While the inverter 1 is in the L state, the inverter 4 is in the H state. Accordingly, the transistor M4 of the constant current source 5 turns on, so that the constant current In flows out of the one end of the capacitive element C1.

Also, the current Ip flows into and the current In flows out of the capacitive element Cadd1 which represents the parasitic capacitance between the node NA and the ground.

The constant-current bias generator circuit 6 controls biases applied to the current sources 5a and 5b such that the current sources 5a and 5b output a constant current free from the influence of the source voltage and temperature.

Referring now to a timing chart, operation of the oscillation circuit shown in FIG. 1 will be described.

Figure 2:
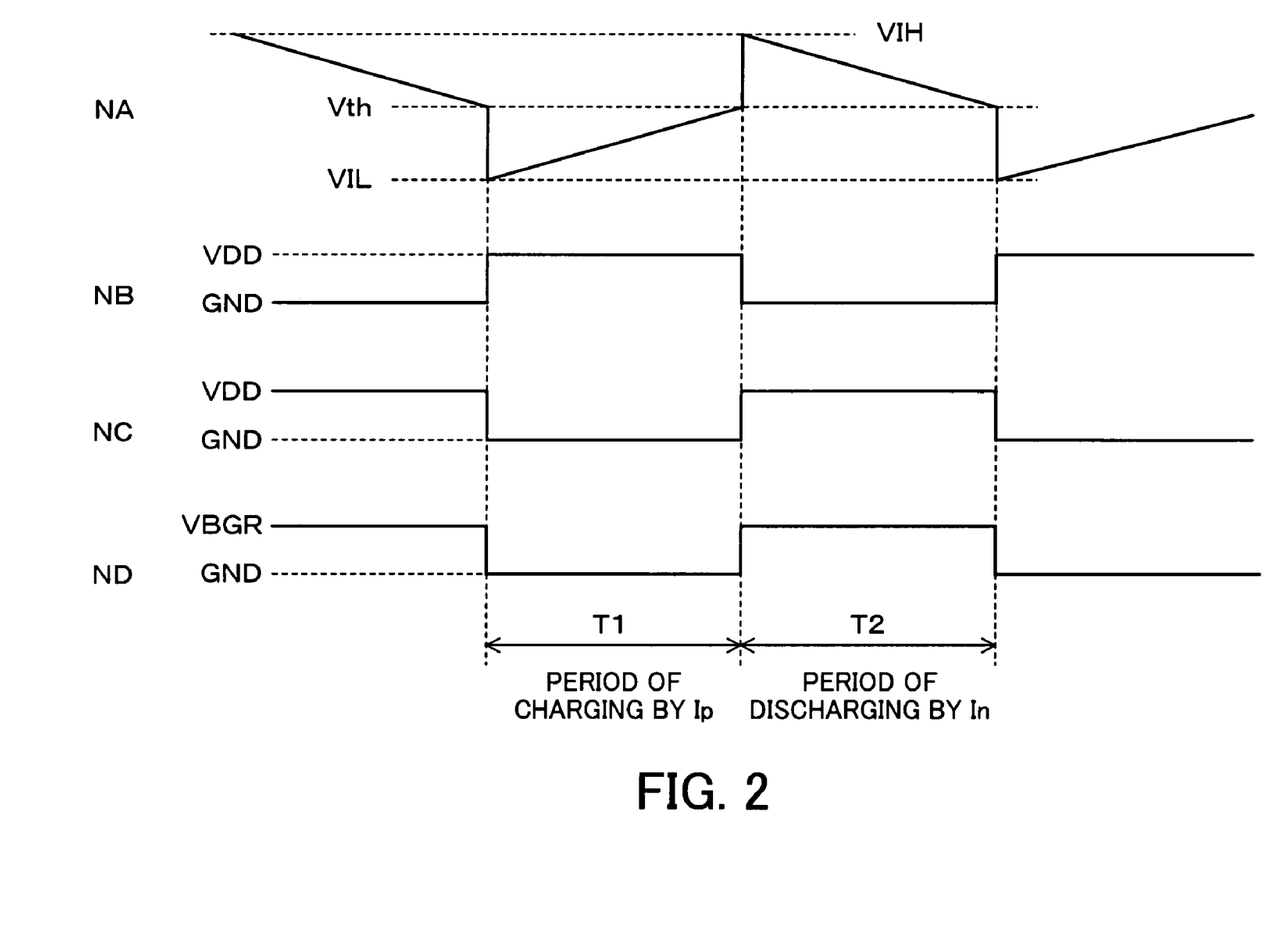
FIG. 2 is a timing chart illustrating operation of the oscillation circuit of FIG. 1.

FIG. 2 is a timing chart illustrating the operation of the oscillation circuit of FIG. 1.

In FIG. 2 are shown voltage changes at the nodes NA, NB, NC and ND of the oscillation circuit of FIG. 1. The voltage at the node NA varies about the threshold voltage Vth of the inverter 1. The voltages of the nodes NB and NC vary between the voltage GND and the source voltage VDD, and the voltage of the node ND varies between the voltage GND and the voltage VBGR output from the constant voltage source 3.

As shown in FIG. 2, the voltage of the node NA falls at a constant rate as the current In flows out of the capacitive element C1. When the voltage of the node NA becomes lower than the threshold voltage Vth of the inverter 1, the inverter 1 outputs the voltage VDD. Consequently, the voltage of the node NB rises to VDD as shown in the figure.

Since the voltage of the node NB rises to VDD, the transistor M2 turns on, so that the voltage of the node ND drops to GND. At this time, because of coupling through the capacitive element C1, the voltage of the node NA sharply drops from the threshold voltage Vth down to a voltage VIL.

Also, when the voltage of the node NB rises to VDD, the voltage of the node NC drops to GND by the action of the inverter 4, so that the transistor M3 of the constant current source 5 turns on with the voltage GND input to the gate thereof. Consequently, the current Ip flows from the current source 5a into the one end of the capacitive element C1, with the result that the voltage of the node NA rises at a constant rate, as shown in FIG. 2.

When the voltage of the node NA rises above the threshold voltage Vth, the inverter 1 outputs the voltage GND, and accordingly, the voltage of the node NB drops to GND, as shown in FIG. 2.

Since the voltage of the node NB drops to GND, the transistor M1 turns on, so that the voltage of the node ND rises to VBGR. At this time, because of the coupling through the capacitive element C1, the voltage of the node NA sharply rises from the threshold voltage Vth up to a voltage VIH.

Also, when the voltage of the node NB drops to GND, the voltage of the node NC rises to VDD by the action of the inverter 4, so that the transistor M4 of the constant current source 5 turns on with the voltage VDD input to the gate thereof. Consequently, the current In flows out of the one end of the capacitive element C1 by the action of the current source 5b, with the result that the voltage of the node NA falls at a constant rate, as shown in FIG. 2.

In this manner, when the connection of the other end of the capacitive element C1 is switched over from the ground to the constant voltage source 3, the voltage at the one end of the capacitive element C1 rises to VIH due to the coupling. Then, the constant current In flows out of the one end of the capacitive element C1 by the action of the current source 5b. In this case, the voltage at the one end of the capacitive element C1 falls at a constant rate as the constant current In flows out. When the voltage at the one end of the capacitive element C1 becomes lower than the threshold voltage Vth of the inverter 1, the inverter 1 outputs the voltage VDD, turning on the transistors M2 and M3. As a result, the connection of the other end of the capacitive element C1 is switched over from the constant voltage source 3 to the ground, so that the voltage at the one end of the capacitive element C1 drops to VIL due to the coupling. Then, the constant current Ip flows into the one end of the capacitive element C1 by the action of the current source 5a. In this case, the voltage at the one end of the capacitive element C1 rises at a constant rate as the constant current Ip flows in. When the voltage at the one end of the capacitive element C1 becomes higher than the threshold voltage Vth of the inverter 1, the inverter 1 outputs the voltage GND, turning on the transistors M1 and M4. As a result, the connection of the other end of the capacitive element C1 is switched over from the ground to the constant voltage source 3, so that the voltage at the one end of the capacitive element C1 rises to VIH due to the coupling. Then, the constant current In flows out of the one end of the capacitive element C1 by the action the current source 5b. The oscillation circuit repeats the above operation to perform oscillation operation.

Thus, the voltage at the one end of the capacitive element C1 varies about the threshold voltage Vth within a fixed voltage range (VIH–Vth, Vth–VIL) free from the influence of the source voltage and temperature. Also, the constant currents Ip and In, which are free from the influence of the source voltage and temperature, flow into and out of the one end of the capacitive element C1, respectively, to charge and discharge the capacitive element over fixed periods. Consequently, the voltage at the one end of the capacitive element C1 varies at a fixed period without being influenced by the source voltage and temperature.

Since the voltage at the one end of the capacitive element C1 varies about the threshold voltage Vth within the fixed voltage range free from the influence of the source voltage and temperature, the amplitude of the voltage variation remains constant even if the threshold voltage Vth of the inverter 1 fluctuates. Also, the capacitive element C1 is charged and discharged over the fixed periods as the constant currents Ip and In, which are free from the influence of the source voltage and temperature, flow into and out of the one end of the capacitive element, respectively. Accordingly, even in the case where there is nonuniformity in inverter threshold voltage Vth or the threshold voltage Vth of the inverter 1 fluctuates, the voltage at the one end of the capacitive element C1 varies at a fixed period.

Referring to FIG. 2, the oscillation period of the oscillation circuit shown in FIG. 1 will be derived. In the following, the period over which the capacitive element C1 is charged with the current Ip supplied to the one end thereof is referred to as T1, and the period over which the capacitive element is discharged with the current In flowing out of the one end thereof is referred to as T2. The period T1 will be derived first.

At the beginning of the period T1, the voltage of the node NA drops from the threshold voltage Vth to VIL due to the coupling with the voltage GND of the node ND through the capacitive element C1, as shown in FIG. 2. The voltage VIL is given by the following equation:

$$VIL = Vth - \frac{C1}{(C1 + Cadd)} \cdot VBGR \quad (3)$$

where Vth is the threshold voltage of the inverter 1, C1 is the capacitance of the capacitive element C1, Cadd is the capacitance of the capacitive element Cadd1, and VBGR is the voltage output from the constant voltage source 3.

After dropping to the voltage VIL, the voltage of the node NA rises as the capacitive element C1 is charged with the current Ip supplied to the one end thereof. When the voltage of the node NA reaches the threshold voltage Vth, the period T1 ends. During the period T1, the capacitive elements C1 and Cadd1 are charged by the current Ip and the voltage rises up to Vth–VIL. Accordingly, the charge Q stored in the capacitive elements C1 and Cadd1 is given by the following Equation (4):

$$Q = Ip \cdot T1 = (C1 + Cadd) \cdot (Vth - VIL) \quad (4)$$

where Ip is the current output from the current source 5a.

Equation (4) is substituted into Equation (3), then the period T1 is derived as indicated by the following Equation (5):

$$T1 = \frac{1}{Ip} \cdot (C1 + Cadd) \cdot \left(Vth - Vth + \frac{C1}{C1 + Cadd} \cdot VBGR\right) \quad (5)$$
$$= \frac{C1 \cdot VBGR}{Ip}$$

The period T2 will be now derived. As shown in FIG. 2, at the beginning of the period T2, the voltage of the node NA rises from the threshold voltage Vth to VIH due to the coupling with the voltage VBGR of the node ND through the capacitive element C1. The voltage VIH is given by the following equation:

$$VIH = Vth + \frac{C1}{(C1 + Cadd)} \cdot VBGR \quad (6)$$

Equations (3) and (6) reveal that the voltage of the node NA varies with a fixed amplitude even if the threshold voltage Vth fluctuates.

After rising up to the voltage VIH, the voltage of the node NA falls as the capacitive element C1 is discharged with the current In flowing out of the one end thereof. When the voltage of the node NA drops to the threshold voltage Vth, the period T2 ends. During the period T2, the capacitive elements C1 and Cadd1 are discharged as the current In flows out, and the voltage drops by VIH–Vth. Therefore, the charge stored in the capacitive elements C1 and Cadd1 is given by the following Equation (7):

$$Q = In \cdot T2 = (C1 + Cadd) \cdot (VIH - Vth) \quad (7)$$

where In is the current output from the current source 5b.

Equation (7) is substituted into Equation (6), then the period T2 is derived as indicated by the following Equation (8):

$$T2 = \frac{1}{In} \cdot (C1 + Cadd) \cdot \left(Vth + \frac{C1}{C1 + Cadd} \cdot VBGR - Vth\right) \quad (8)$$
$$= \frac{C1 \cdot VBGR}{In}$$

The oscillation period T3 of the oscillation circuit is given by T3=T1+T2. Therefore, Equations (5) and (8) are added together, whereby the oscillation period T3 is derived as indicated by the following Equation (9):

$$T3 = T1 + T2 \quad (9)$$
$$= C1 \cdot VBGR \cdot \left(\frac{1}{In} + \frac{1}{Ip}\right)$$

As seen from Equation (9), the oscillation frequency (period) of the oscillation circuit shown in FIG. 1 is determined only by the capacitance of the capacitive element C1, the constant voltage VBGR of the constant voltage source 3 and the constant currents Ip and In of the constant current source 5 and is free from the influence of the parasitic capacitance and the threshold voltage Vth of the inverter 1.

The voltage VBGR and the currents Ip and In are free from the influence of fluctuations in the source voltage and temperature, so that the oscillation circuit is capable of oscillation at a constant frequency independent of the source voltage and temperature. The capacitance of a capacitive element (capacitor) is generally constant independent of temperature.

The constant voltage source 3 and the constant-current bias generator circuit 6 will be now described.

The constant-current bias generator circuit 6 will be explained first.

Figure 3:
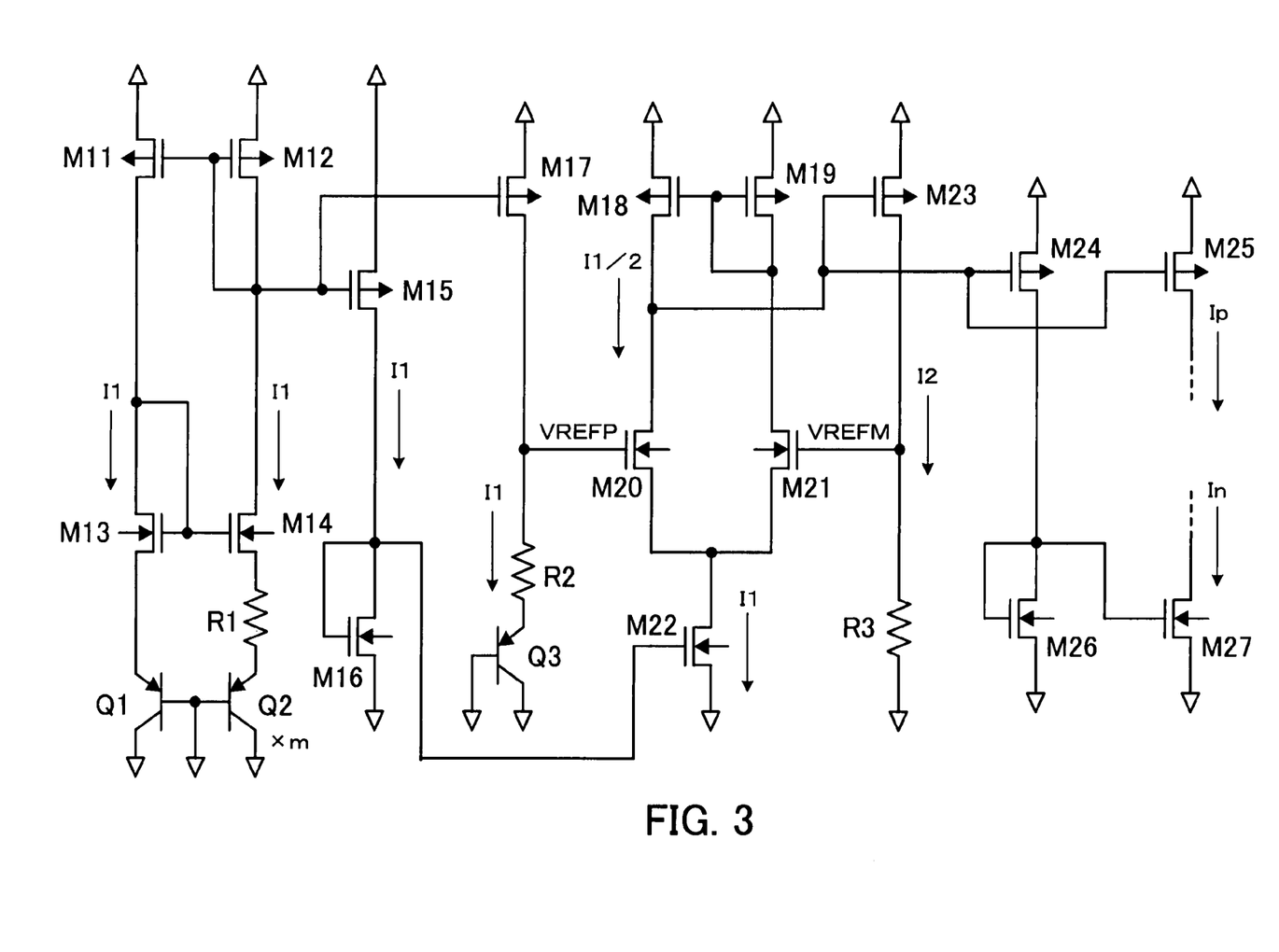
FIG. 3 is a circuit diagram of a constant-current bias generator circuit.

FIG. 3 is a circuit diagram of the constant-current bias generator circuit.

As shown in the figure, the constant-current bias generator circuit 6 includes transistors M11 to M27, transistors Q1 to Q3, and resistors R1 to R3.

The transistors M11 and M12 are each a P-channel MOS transistor. The sources of the transistors M11 and M12 are connected to a power source. The gates of the transistors M11 and M12 are connected to each other and also connected to the drain of the transistor M12. The drain of the transistor M11 is connected to the drain of the transistor M13, and the drain of the transistor M12 is connected to the drain of the transistor M14.

The transistors M13 and M14 are N-channel MOS transistors. The gates of the transistors M13 and M14 are connected to each other and also connected to the drain of the transistor M13. The source of the transistor M13 is connected to the emitter of the transistor Q1, and the source of the transistor M14 is connected to the emitter of the transistor Q2 through the resistor R1.

The transistors Q1 and Q2 are PNP bipolar transistors. The bases of the transistors Q1 and Q2 are connected to each other and also connected to a ground. The collectors of the transistors Q1 and Q2 are grounded.

The transistors M11 to M14, the transistors Q1 and Q2 and the resistor R1 constitute a bias current generator circuit for generating a bias current. A current I1 flows through the transistors M13 and M14 by the action of the bias current generator circuit.

The transistor M15 is a P-channel MOS transistor, and the transistor M16 is an N-channel MOS transistor. The transistor M15 has a source connected to the power source and a gate connected to the drain of the transistor M12. The drain of the transistor M15 is connected to the gate and drain of the transistor M16. The source of the transistor M16 is grounded.

The transistors M15 and M16 are a current mirror and constitute a circuit for generating a bias current by means of an operational amplifier, described later. A current I1, which is the same as the current I1 passing through the transistors M13 and M14, flows through the transistor M16.

The transistor M17 is a P-channel MOS transistor, and the transistor Q3 is a PNP bipolar transistor. The transistor M17 has a source connected to the power source and a gate connected to the drain of the transistor M12. The drain of the transistor M17 is connected to the emitter of the transistor Q3 through the resistor R2. The base and collector of the transistor Q3 are grounded.

The transistor M17, the resistor R2 and the transistor Q3 constitute a circuit for determining the temperature dependency of the voltage generated by the current I1 of the bias current generator circuit. A voltage VREFP is generated at the drain of the transistor M17. The temperature dependency of the voltage VREFP is determined by suitably setting the resistances of the resistors R1 and R2.

The transistors M18 and M19 are P-channel MOS transistors and have their sources connected to the power source. The gates of the transistors M18 and M19 are connected to each other and also connected to the drain of the transistor M19. The drain of the transistor M18 is connected to the drain of the transistor M20, and the drain of the transistor M19 is connected to the drain of the transistor M21.

The transistors M20 and M21 are N-channel MOS transistors. The gate of the transistor M20 is connected to the drain of the transistor M17, and the gate of the transistor M21 is connected to the drain of the transistor M23. The sources of the transistors M20 and M21 are connected to each other and also connected to the drain of the transistor M22.

The transistor M22 is an N-channel MOS transistor. The gate of the transistor M22 is connected to the gate and drain of the transistor M16, and the source of the transistor M22 is grounded.

The transistor M23, which is a P-channel MOS transistor, has a source connected to the power source and a gate connected to the drain of the transistor M18. The drain of the transistor M23 is connected to the gate of the transistor M21 and also to the ground through the resistor R3.

The transistors M18 to M23 and the resistor R3 constitute an operational amplifier. Provided that the gate of the transistor M20 is a positive-phase input terminal, that the gate of the transistor M21 is a negative-phase input terminal and that the drain of the transistor M23 is an output terminal, the operational amplifier constitutes a voltage follower. The aforementioned temperature dependency of the voltage VREFP is made equal to the temperature dependency of the resistor R3, whereby a constant current I2 independent of the source voltage and temperature flows through the transistor M23. A current I1 flows through the transistor M22 by the action of the aforementioned mirror circuit, and therefore, a current I1/2, which is ½ of the current I1, flows through the transistor M20.

The transistors M24 and M25 are P-channel MOS transistors, and the transistors M26 and M27 are N-channel MOS transistors. The transistor M24 has a source connected to the power source and a gate connected to the drain of the transistor M18. The transistor M25 has a source connected to the power source and a gate connected to the drain of the transistor M18. The gate and drain of the transistor M26 are connected to each other and also connected to the drain of the transistor M24. The source of the transistor M26 is grounded. The gate of the transistor M27 is connected to the drain of the transistor M24, and the source of the transistor M27 is grounded.

The transistor M25 corresponds to the current source 5a in FIG. 1 and the current Ip flows therethrough. The transistor M27 corresponds to the current source 5b in FIG. 1 and the current In flows therethrough. The transistors M24 and M26 constitute a current mirror, and therefore, a constant current I2 independent of the source voltage and temperature flows through the transistors M25 and M27 as the currents Ip and In, respectively.

The current I2 (currents Ip, In) shown in FIG. 3 will be now derived.

The current I1 in FIG. 3 is given by the following Equation (10):

$$I1 = \frac{1}{\alpha \cdot R1} \cdot \frac{kT}{q} \cdot \ln(m) \quad (10)$$

where k is the Boltzmann constant (1.38×10$^{-23}$ J/K), q is the elementary charge (1.602×10$^{-19}$ C), T is the absolute temperature, α is the temperature coefficient of the resistance, m is the area ratio of the transistor Q2 to the transistor Q1, and R1 is the resistance of the resistor R1.

Since the current flowing through the resistor R2 is I1, the voltage VREFP is given by the following Equation (11):

$$VREFP = \alpha \cdot R2 \cdot I1 + VBE \quad (11)$$
$$= R2 \cdot \frac{1}{R1} \cdot \frac{kT}{q} \cdot \ln(m) + VBE$$

where R2 is the resistance of the resistor R2, I1 is the current value of the current I1, and VBE is the diode voltage of the transistor Q3.

Where the resistors R1 and R2 are made of resistors of the same kind, the temperature coefficients α of their resistance values cancel out each other. Extracting the temperature coefficients α from the resistance values of the resistors R1 and R2, then α·R2/α·R1, and thus the temperature coefficients α are canceled out.

A voltage VREFM is derived by buffering the voltage VREFP by means of the voltage follower constituted by the operational amplifier, and therefore, VREFM=VREFP. Accordingly, the current I2 flowing through the resistor R3 is given by the following Equation (12):

$$I2 = \frac{VREFM}{\alpha \cdot R3} \quad (12)$$
$$= \frac{VREFP}{\alpha \cdot R3}$$
$$= \frac{1}{\alpha \cdot R3} \cdot \left( \frac{R2}{R1} \cdot \frac{kT}{q} \ln(m) + VBE \right)$$

In Equation (12), the first term in the parentheses has a positive coefficient with respect to temperature because of the absolute temperature T. The second term is the diode voltage of the transistor Q3 and thus has a negative coefficient with respect to temperature. Accordingly, the temperature coefficients in the parentheses can be varied freely by means of the resistance value of the resistor R2 or R1.

Then, in Equation (12), the temperature coefficient of the resistor R2 or R1 is selected so that the overall temperature coefficient in the parentheses may be equal to the temperature coefficient α in the denominator of the fraction which is multiplied by the sum of the parenthesized terms, whereby the temperature dependency of the current I2 can be eliminated. Equation (12) does not have a term including the source voltage, and therefore, the current I2 is independent of the source voltage.

The current I2 is output by the current mirror as the currents Ip and In. Accordingly, the currents Ip and In flow at a constant level independent of the source voltage and temperature.

The constant voltage source 3 will be now described. For the constant voltage source 3, a band-gap reference circuit may be used. The use of a band-gap reference circuit makes it possible to easily obtain a constant voltage independent of the source voltage and temperature.

Figure 4:
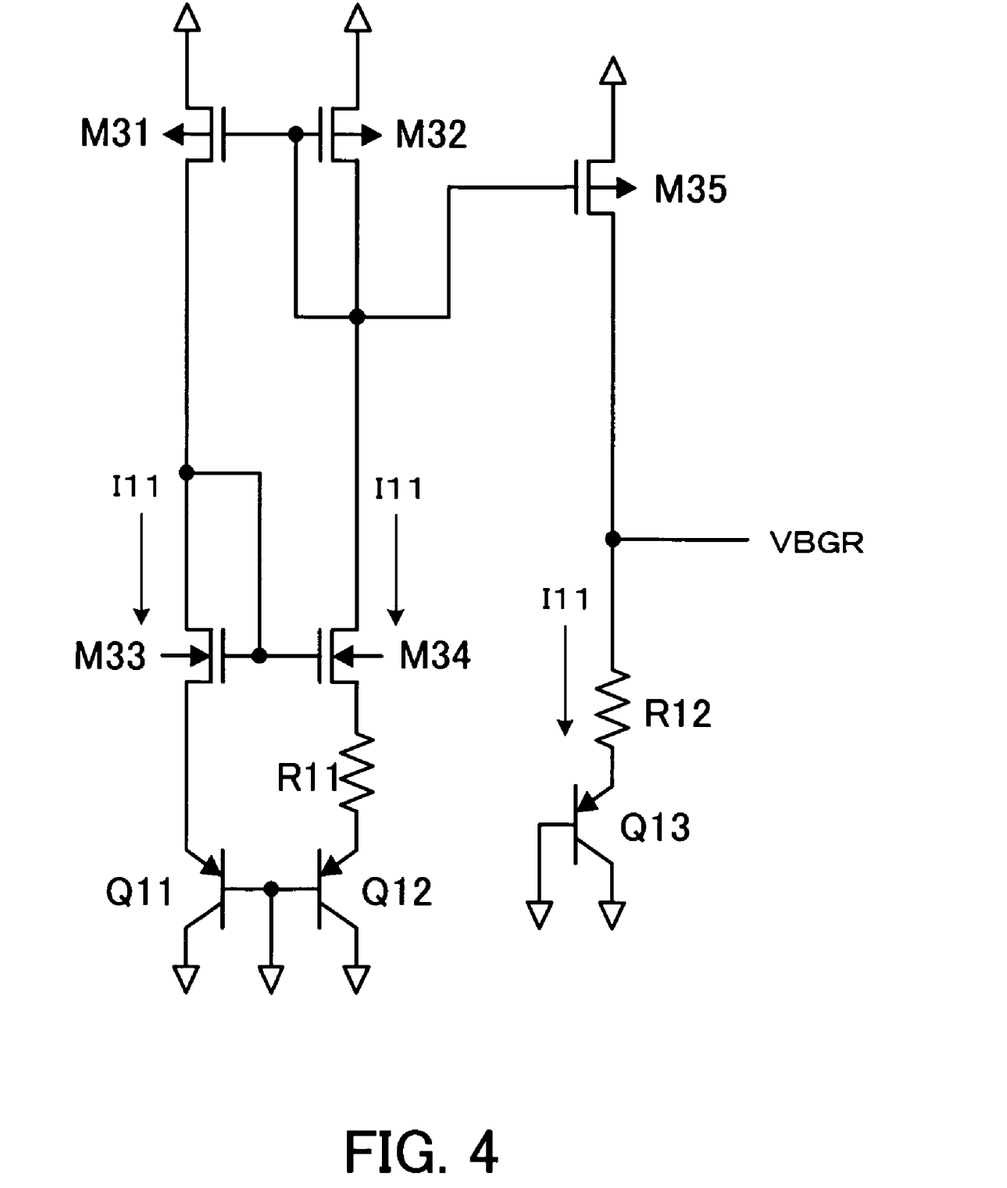
FIG. 4 is a circuit diagram of a constant voltage source.

FIG. 4 is a circuit diagram of such a constant voltage source.

As shown in the figure, the constant voltage source 3 includes transistors M31 to M35, transistors Q11 to Q13, and resistors R11 and R12.

The transistors M31 and M32 are P-channel MOS transistors and have their sources connected to the power source. The gates of the transistors M31 and M32 are connected to each other and also connected to the drain of the transistor M32. The drain of the transistor M31 is connected to the drain of the transistor M33, and the drain of the transistor M32 is connected to the drain of the transistor M34.

The transistors M33 and M34 are N-channel MOS transistors. The gates of the transistors M33 and M34 are connected to each other and also connected to the drain of the transistor M33. The source of the transistor M33 is connected to the emitter of the transistor Q11, and the source of the transistor M34 is connected to the emitter of the transistor Q12 through the resistor R11.

The transistors Q11 and Q12 are PNP bipolar transistors. The bases of the transistors Q11 and Q12 are connected to each other and also connected to the ground. The collectors of the transistors Q11 and Q12 are grounded.

The transistor M35 is a P-channel MOS transistor, and the transistor Q13 is a PNP bipolar transistor. The transistor M35 has a source connected to the power source and a gate connected to the drain of the transistor M32. The drain of the transistor M35 is connected to the emitter of the transistor Q13 through the resistor R12. The base and collector of the transistor Q13 are grounded.

The transistors M31 to M35, the transistors Q11 to Q13 and the resistors R11 and R12 constitute a band-gap reference circuit. The transistors M31 to M34, the resistor R11 and the transistors Q11 and Q12 in FIG. 4 correspond, respectively, to the transistors M11 to M14, the resistor R1, and the transistors Q1 and Q2 in FIG. 3. Also, the transistor M35, the resistor R12 and the transistor Q13 in FIG. 4 correspond, respectively, to the transistor M17, the resistor R2 and the transistor Q3 in FIG. 3.

A current I11 flows through the transistors M33 and M34, as in the case of FIG. 3. The transistor M35, the resistor R12 and the transistor Q13 constitute a circuit for determining the temperature dependency of the voltage VBGR generated by the current I11. By suitably setting the resistances of the resistors R11 and R12, it is possible to make the voltage VBGR constant independently of the source voltage and temperature.

In this manner, the voltage at the one end of the capacitive element C1 is caused to vary with a fixed amplitude about the threshold voltage of the inverter 1 by the constant voltage source 3 which is free from the influence of the source voltage and temperature, and a constant current is made to flow into and out of the one end of the capacitive element C1 by the constant current source 5 which also is free from the influence of the source voltage and temperature, to charge and discharge the capacitive element over fixed periods.

Thus, the capacitive element C1 is charged and discharged at a constant rate in accordance with the voltage which varies with a fixed amplitude free from the influence of the source voltage and temperature, so that the oscillation period remains constant without being influenced by the sources voltage and temperature. Since the voltage at the one end of the capacitive element C1 varies with a fixed amplitude about the threshold voltage of the inverter 1, the oscillation period remains constant even in cases where there is nonuniformity in inverter threshold voltage or the threshold voltage of the inverter 1 fluctuates.

In the oscillation circuit according to the present invention, the voltage at one end of the capacitive element is caused to vary with a fixed amplitude about the threshold voltage of the inverter by the constant voltage source which is free from the influence of the source voltage and temperature, and a constant current is made to flow into and out of the one end of the capacitive element by the constant current source which also is free from the influence of the source voltage and temperature, to charge and discharge the capacitive element over fixed periods.

Thus, the capacitive element is charged and discharged at a constant rate in accordance with the voltage which varies with a fixed amplitude free from the influence of the source voltage and temperature, whereby the oscillation period remains constant without being influenced by the sources voltage and temperature. Also, since the voltage at the one end of the capacitive element varies with a fixed amplitude about the threshold voltage of the inverter, the oscillation period remains constant even in cases where there is non-uniformity in inverter threshold voltage or the threshold voltage of the inverter fluctuates.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An oscillation circuit capable of oscillation by utilizing charging/discharging of a capacitive element, comprising:
   an inverter for inverting a voltage applied to one end of the capacitive element and outputting the inverted voltage;
   a constant voltage source for outputting a constant voltage free from influence of a source voltage and temperature;
   a switching circuit for connecting the other end of the capacitive element to one of the constant voltage source and ground in accordance with the voltage output from the inverter;
   a constant current source for causing a constant current free from the influence of the source voltage and temperature to flow into or out of the one end of the capacitive element in accordance with the voltage output from the inverter, and
   a bias generator circuit for generating a temperature-dependent voltage having temperature dependency identical with that of a resistor and applying the temperature-dependent voltage to the resistor to generate the constant current and thus a bias voltage, wherein the bias generator circuit controls current sources included in the constant current source in accordance with the bias voltage, to generate the constant current.

2. The oscillation circuit according to claim 1, wherein the constant current source causes the current to flow out of the capacitive element when the other end of the capacitive element is connected to the constant voltage source, and causes the current to flow into the capacitive element when the other end of the capacitive element is connected to the ground.

3. The oscillation circuit according to claim 1, wherein the constant voltage source is constituted by a band-gap reference circuit.

4. A semiconductor device including an oscillation circuit capable of oscillation by utilizing charging/discharging of a capacitive element, comprising:
   an inverter for inverting a voltage applied to one end of the capacitive element and outputting the inverted voltage;
   a constant voltage source for outputting a constant voltage free from influence of a source voltage and temperature;
   a switching circuit for connecting the other end of the capacitive element to one of the constant voltage source and ground in accordance with the voltage output from the inverter;
   a constant current source for causing a constant current free from the influence of the source voltage and temperature to flow into or out of the one end of the capacitive element in accordance with the voltage output from the inverter, and
   a bias generator circuit for generating a temperature-dependent voltage having temperature dependency identical with that of a resistor and applying the temperature-dependent voltage to the resistor to generate the constant current and thus a bias voltage,
   wherein the bias generator circuit controls current sources included in the constant current source in accordance with the bias voltage, to generate the constant current.

5. The semiconductor device according to claim 4, wherein the constant current source causes the current to flow out of the capacitive element when the other end of the capacitive element is connected to the constant voltage source, and causes the current to flow into the capacitive element when the other end of the capacitive element is connected to the ground.

6. The semiconductor device according to claim 4, wherein the constant voltage source is constituted by a band-gap reference circuit.

7. An oscillation circuit capable of oscillation by utilizing charging/discharging of a capacitive element, comprising:
   an inverter for inverting a voltage applied to one end of the capacitive element and outputting the inverted voltage;
   a constant voltage source for outputting a constant voltage free from influence of a source voltage and temperature;
   a switching circuit for connecting the other end of the capacitive element to one of the constant voltage source and ground in accordance with the voltage output from the inverter; and
   a constant current source for causing a constant current free from the influence of the source voltage and temperature to flow into or out of the one end of the capacitive element in accordance with the voltage output from the inverter, and
   wherein the switching circuit includes:
      a P-channel transistor having a source connected to the constant voltage source; and
      an N-channel transistor having a source connected to the ground, a drain connected to the drain of the P-channel transistor as well as to the other end of the capacitive element, and a gate connected to the gate of the P-channel transistor and input with the voltage output from the inverter.

8. The oscillation circuit according to claim 7, wherein the constant current source causes the current to flow out of the capacitive element when the other end of the capacitive element is connected to the constant voltage source, and causes the current to flow into the capacitive element when the other end of the capacitive element is connected to the ground.

9. The oscillation circuit according to claim 7, wherein the constant voltage source is constituted by a band-gap reference circuit.

10. An oscillation circuit capable of oscillation by utilizing charging/discharging of a capacitive element, comprising:
   an inverter for inverting a voltage applied to one end of the capacitive element and outputting the inverted voltage;
   a constant voltage source for outputting a constant voltage free from influence of a source voltage and temperature;
   a switching circuit for connecting the other end of the capacitive element to one of the constant voltage source and ground in accordance with the voltage output from the inverter; and
   a constant current source for causing a constant current free from the influence of the source voltage and temperature to flow into or out of the one end of the capacitive element in accordance with the voltage output from the inverter, and
   wherein the constant current source includes:
      a P-channel transistor having a source connected to a current source for causing the current to flow into the capacitive element; and
      an N-channel transistor having a source connected to a current source for causing the current to flow out of the capacitive element, the N-channel transistor having a drain connected to the drain of the P-channel transistor as well as to the one end of the capacitive element, and a gate connected to the gate of the P-channel transistor and input with the voltage output from the inverter.

11. The oscillation circuit according to claim 10, wherein the constant current source causes the current to flow out of the capacitive element when the other end of the capacitive element is connected to the constant voltage source, and causes the current to flow into the capacitive element when the other end of the capacitive element is connected to the ground.

12. The oscillation circuit according to claim 10, wherein the constant voltage source is constituted by a band-gap reference circuit.

13. A semiconductor device including an oscillation circuit capable of oscillation by utilizing charging/discharging of a capacitive element, comprising:
   an inverter for inverting a voltage applied to one end of the capacitive element and outputting the inverted voltage;
   a constant voltage source for outputting a constant voltage free from influence of a source voltage and temperature;
   a switching circuit for connecting the other end of the capacitive element to one of the constant voltage source and ground in accordance with the voltage output from the inverter; and
   a constant current source for causing a constant current free from the influence of the source voltage and temperature to flow into or out of the one end of the capacitive element in accordance with the voltage output from the inverter, and
   wherein the switching circuit includes:
      a P-channel transistor having a source connected to the constant voltage source; and
      an N-channel transistor having a source connected to the ground, a drain connected to the drain of the P-channel transistor as well as to the other end of the capacitive element, and a gate connected to the gate of the P-channel transistor and input with the voltage output from the inverter.

14. The semiconductor device according to claim 13, wherein the constant current source causes the current to flow out of the capacitive element when the other end of the capacitive element is connected to the constant voltage source, and causes the current to flow into the capacitive element when the other end of the capacitive element is connected to the ground.

15. The semiconductor device according to claim 13, wherein the constant voltage source is constituted by a band-gap reference circuit.

16. A semiconductor device including an oscillation circuit capable of oscillation by utilizing charging/discharging of a capacitive element, comprising:
   an inverter for inverting a voltage applied to one end of the capacitive element and outputting the inverted voltage;
   a constant voltage source for outputting a constant voltage free from influence of a source voltage and temperature;
   a switching circuit for connecting the other end of the capacitive element to one of the constant voltage source and ground in accordance with the voltage output from the inverter; and
   a constant current source for causing a constant current free from the influence of the source voltage and temperature to flow into or out of the one end of the capacitive element in accordance with the voltage output from the inverter, and
   wherein the constant current source includes:
      a P-channel transistor having a source connected to a current source for causing the current to flow into the capacitive element; and
      an N-channel transistor having a source connected to a current source for causing the current to flow out of the capacitive element, the N-channel transistor having a drain connected to the drain of the P-channel transistor as well as to the one end of the capacitive element, and a gate connected to the gate of the P-channel transistor and input with the voltage output from the inverter.

17. The semiconductor device according to claim 16, wherein the constant current source causes the current to flow out of the capacitive element when the other end of the capacitive element is connected to the constant voltage source, and causes the current to flow into the capacitive element when the other end of the capacitive element is connected to the ground.

18. The semiconductor device according to claim 16, wherein the constant voltage source is constituted by a band-gap reference circuit.

* * * * *

UNITED STATES PATENT AND TRADEMARK OFFICE
CERTIFICATE OF CORRECTION

| | | |
|---|---|---|
| PATENT NO. | : 7,068,116 B2 | Page 1 of 1 |
| APPLICATION NO. | : 10/877981 | |
| DATED | : June 27, 2006 | |
| INVENTOR(S) | : Tatsuo Kato et al. | |

It is certified that error appears in the above-identified patent and that said Letters Patent is hereby corrected as shown below:

<u>Title Page</u> -

Item [73] Assignee, please correct the Assignee's name to read

-- Fujitsu Limited --.

Signed and Sealed this

Seventh Day of August, 2007

JON W. DUDAS
*Director of the United States Patent and Trademark Office*